United States Patent
Akiba et al.

(10) Patent No.: US 8,034,893 B2
(45) Date of Patent: Oct. 11, 2011

(54) RESIN RESOLUTION COMPOSITION, POLYIMIDE RESIN, AND SEMICONDUCTOR DEVICE

(75) Inventors: Hideki Akiba, Annaka (JP); Toshio Shiobara, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/475,043

(22) Filed: Jun. 27, 2006

(65) Prior Publication Data

US 2007/0066796 A1    Mar. 22, 2007

(30) Foreign Application Priority Data

Jun. 28, 2005    (JP) .................................. 2005-187898

(51) Int. Cl.
*C08G 69/26* (2006.01)

(52) U.S. Cl. .......... 528/353; 528/310; 528/322; 528/26; 528/27

(58) Field of Classification Search .................. 524/588; 428/209; 528/353, 310, 322, 26, 27
See application file for complete search history.

(56) References Cited

U.S. PATENT DOCUMENTS

| 6,441,416 | B1 * | 8/2002 | Tanaka et al. .................. 257/295 |
| 6,828,390 | B2 * | 12/2004 | Uhara ........................... 525/436 |
| 7,521,744 | B2 | 4/2009 | Tanaka et al. |
| 2003/0216505 | A1 * | 11/2003 | Akiba et al. .................. 524/588 |
| 2004/0247907 | A1 * | 12/2004 | Goda et al. ................. 428/473.5 |

FOREIGN PATENT DOCUMENTS

| JP | 63-164247 | 7/1988 |
| JP | 10-270611 | 10/1998 |
| JP | 2000-265056 | 9/2000 |
| JP | 2002-293933 | 10/2002 |

OTHER PUBLICATIONS

2005 PWB Expo technology publication.*
Goda et al Polymer materials . . . Eng. Materials, vol. 51, p. 44-47 (203).*
Newlong Seimitsu Kogyo "News and Topics" webpage.*
2005 PWB Expo technology publication, 2005.*
Goda et al. Polymer materials.changing through nanotechnology. Polyimide-silica hybrid film.. Eng. Materials, vol. 51, p. 44-47 (2003).*
Newlong Seimitsu Kogyo "News and Topics" webpage, 2005.*

* cited by examiner

*Primary Examiner* — James J Seidleck
*Assistant Examiner* — Gregory Listvoyb
(74) *Attorney, Agent, or Firm* — Birch, Stewart, Kolasch & Birch, LLP

(57) ABSTRACT

A resin solution composition comprising (A) a polyamic acid resin, (B) an alkoxysilyl-containing polyamic acid resin, and (C) an organic solvent cures into a product that has good substrate adhesion and heat resistance and is effective in forming a protective film on a semiconductor device prior to encapsulation with epoxy resin molding material (molding compound) in that it overcomes the chip cracking and thermal deterioration problems of semiconductor packages by thermal stress.

12 Claims, No Drawings

RESIN RESOLUTION COMPOSITION, POLYIMIDE RESIN, AND SEMICONDUCTOR DEVICE

CROSS-REFERENCE TO RELATED APPLICATION

This non-provisional application claims priority under 35 U.S.C. §119(a) on Patent Application No. 2005-187898 filed in Japan on Jun. 28, 2005, the entire contents of which are hereby incorporated by reference.

TECHNICAL FIELD

This invention relates to resin solution compositions capable of forming cured parts (or polyimide resins) having improved adhesion to substrates and good heat resistance and low stress, polyimide resins, and semiconductor devices.

BACKGROUND ART

Polyimide resins are widely used as resin varnish for semiconductor interlevel dielectric or surface protective film due to their excellent properties including heat resistance, flame retardance, mechanical properties and electrical insulation. In general, polyimide resins in varnish form in solvents are applied to semiconductor devices directly or via a dielectric film and cured to form a protective film of polyimide resin, after which the semiconductor devices are further encapsulated with epoxy resin or similar molding materials. The resulting packages have the problem that different coefficients of expansion among the components, semiconductor member, substrate and encapsulant allow thermal stresses to generate during subsequent thermal cycling and solder reflow steps, which can invite chip cracks and thermal deterioration. It is thus desired to reduce the modulus of elasticity of polyimide resin so that the protective film may absorb the stress. One approach is to incorporate siloxane linkages into the polyimide resin skeleton for providing a lower modulus of elasticity. Regrettably, the cured film of the resulting resin has a lower glass transition temperature (Tg), leading to a decline of heat resistance.

Nowadays, packages are being reduced in size and profile, and the surface mount type packaging becomes the mainstream packaging technology. Under the circumstances, many prior art epoxy resin compositions fail to maintain satisfactory reliability. As the solders are also tailored to be lead free, the solder reflow temperature is increased to 260° C., which gives rise to the trouble that packages having absorbed moisture will crack during soldering or even if no cracks generate, moisture resistance will decline. It would be desirable from this standpoint as well to have a protective film with better heat resistance and quality.

DISCLOSURE OF THE INVENTION

An object of the invention is to provide resin solution compositions capable of forming resin coatings having firm adhesion to substrates and good heat resistance and effectively overcoming the problems of semiconductor packages including chip cracking and thermal deterioration by thermal stress; polyimide resins; and semiconductor devices.

The inventors have found that a polyamic acid resin of the general formula (1) defined below is combined with an alkoxysilyl-containing polyamic acid resin of the general formula (3) defined below to form a material which has good adhesion and heat resistance and is effective in forming a protective film on a semiconductor device prior to encapsulation with an epoxy resin molding material (an epoxy resin molding compound) in that it overcomes the problems of semiconductor packages including chip cracking and thermal deterioration by thermal stress.

In one embodiment, the invention provides a resin solution composition comprising as essential components, (A) a polyamic acid resin having the general formula (1):

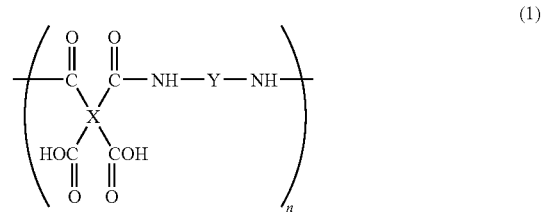

wherein X is a tetravalent organic radical containing an aromatic or aliphatic ring, Y is a divalent organic radical, and n is an integer of 1 to 300, (B) an alkoxysilyl-containing polyamic acid resin having the general formula (3):

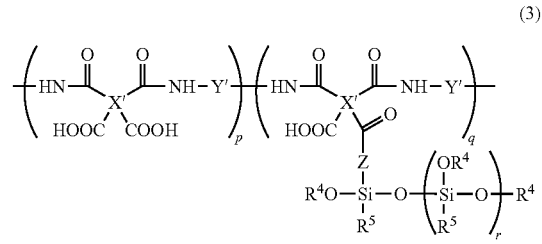

wherein X' is a tetravalent organic radical, Y' is a divalent organic radical, Z is a radical of the formula:

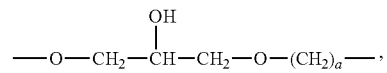

$R^4$ is $C_1$-$C_3$ alkyl, $R^5$ is $C_1$-$C_3$ alkyl or alkoxy, the subscript a is an integer of 0 to 4, p is an integer of 1 to 300, q is an integer of 1 to 300, and r is an integer of 1 to 100, the recurring units with the subscripts p and q being randomly arranged, and (C) an organic solvent.

In a preferred embodiment, Y in formula (1) comprises 1 to 80 mol % of a divalent organic radical having the structural formula (2):

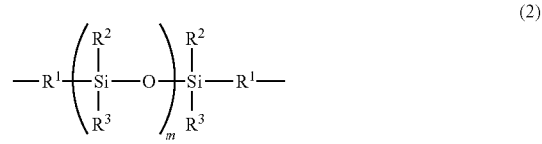

wherein $R^1$ is a divalent organic radical of 3 to 9 carbon atoms, $R^2$ and $R^3$ are each independently a substituted or unsubstituted monovalent hydrocarbon radical of 1 to 8 carbon atoms, and m is an integer of 1 to 200.

Other embodiments of the invention include a polyimide resin obtained by curing the resin solution composition; a semiconductor device coated with a cured film of the resin solution composition; and a semiconductor device encapsulated with an epoxy resin molding material (molding compound) via the cured film.

BENEFITS OF THE INVENTION

The resin solution composition of the invention cures into a polyimide resin or product that has good adhesion to substrates and heat resistance and is effective as protective film on a semiconductor device prior to encapsulation with an epoxy resin molding material (molding compound) in that it effectively overcomes the problems of semiconductor packages including chip cracking and thermal deterioration by thermal stress.

DESCRIPTION OF THE PREFERRED EMBODIMENTS

Component (A) is a polyamic acid resin having the general formula (1):

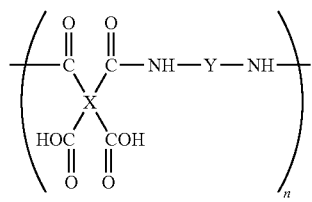

(1)

wherein X is a tetravalent organic radical containing an aromatic or aliphatic ring, Y is a divalent organic radical, and n is an integer of 1 to 300.

The polyamic acid resin having formula (1) may be prepared by the reaction of substantially equimolar amounts of a tetracarboxylic dianhydride having the structural formula (4):

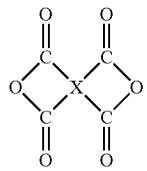

(4)

wherein X is as defined above with a diamine having the structural formula (5):

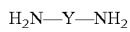

$H_2N-Y-NH_2$ (5)

wherein Y is as defined above in an organic solvent in an ordinary way. It is noted that in formula (1), n is an integer of 1 to 300, preferably an integer of 2 to 300, more preferably an integer of 5 to 300. Polyamic acid resins having such a number of recurring units can be readily obtained by the above procedure.

Illustrative, non-limiting examples of the tetracarboxylic dianhydride having formula (4) are given below.

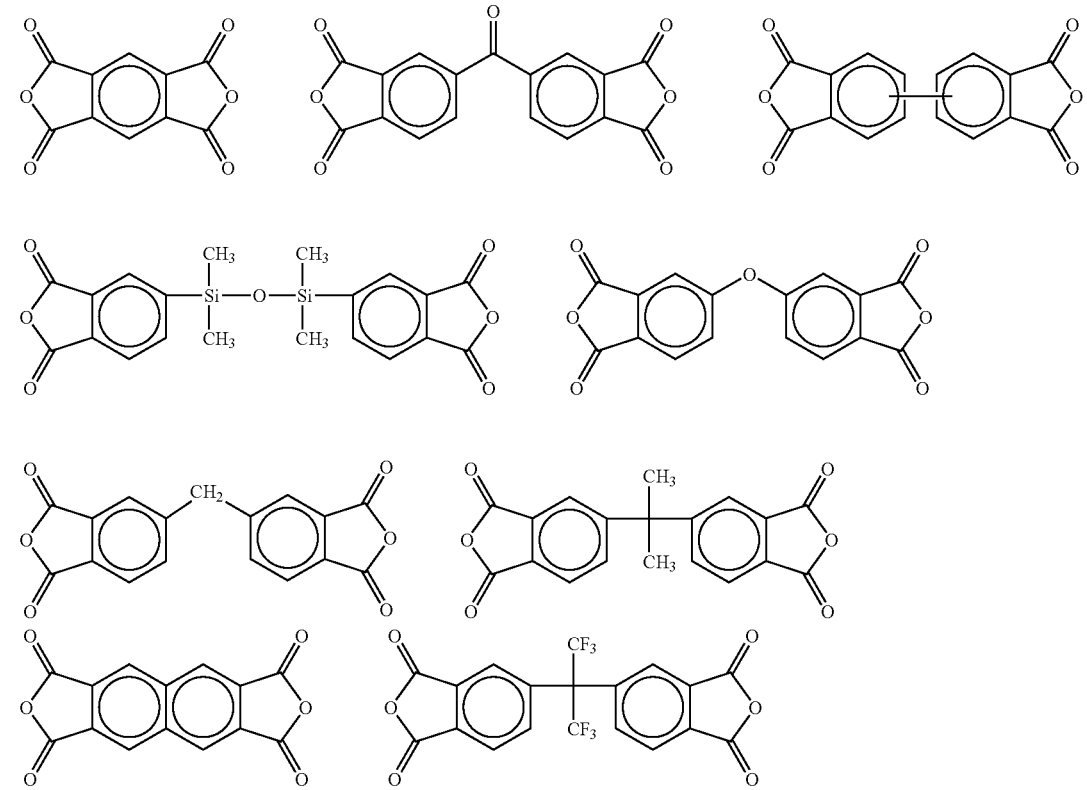

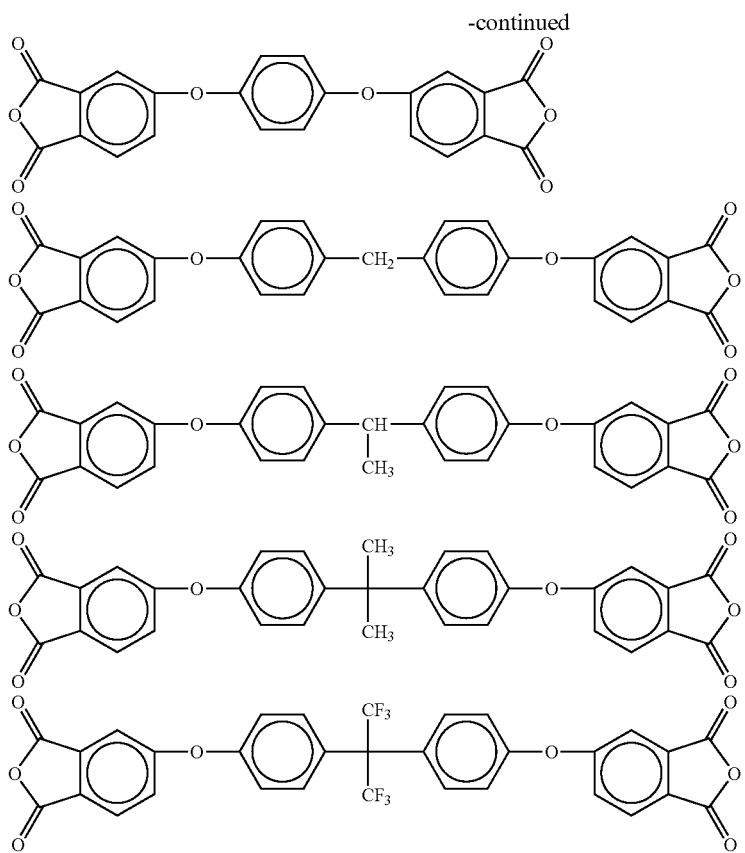

One or more compounds selected from the foregoing may be used as the tetracarboxylic dianhydride having formula (4).

Preferred for substrate adhesion and flexibility is the diamine having formula (5) comprising 1 to 80 mol %, more preferably 1 to 50 mol % of a diaminosiloxane compound having the structural formula (6):

$$H_2N-R^1-\left(\begin{array}{c}R^2\\|\\Si-O\\|\\R^3\end{array}\right)_m\begin{array}{c}R^2\\|\\Si-R^1-NH_2\\|\\R^3\end{array} \quad (6)$$

wherein $R^1$, $R^2$, $R^3$ and m are as defined above.

In formula (6) representative of the siloxanediamine or α,ω-diaminosiloxane, $R^1$ is an organic radical of 3 to 9 carbon atoms which are typically selected from divalent hydrocarbon radicals which may contain an ether oxygen atom, including alkylene radicals such as —$(CH_2)_3$—, —$(CH_2)_4$—, —$CH_2CH(CH_3)$—, —$(CH_2)_6$—, —$(CH_2)_8$—; arylene radicals such as

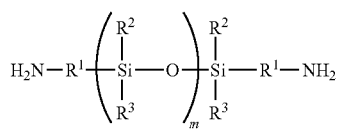

alkylene-arylene radicals as combinations of the foregoing; oxyalkylene radicals such as —$(CH_2)_3$—O— and —$(CH_2)_4$—O—; oxyarylene radicals such as

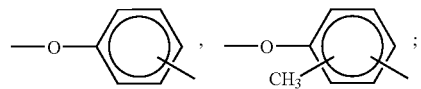

and oxyalkylene-arylene radicals as combinations of the foregoing, such as

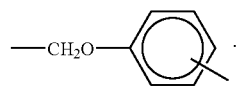

$R^2$ and $R^3$ are independently selected from substituted or unsubstituted monovalent hydrocarbon radicals of 1 to 8 carbon atoms, for example, alkyl radicals such as methyl, ethyl, propyl, isopropyl, butyl, isobutyl, tert-butyl, hexyl, cyclohexyl, 2-ethylhexyl and octyl; alkenyl radicals such as vinyl, allyl, propenyl, isopropenyl, butenyl, isobutenyl, and hexenyl; aryl radicals such as phenyl, tolyl and xylyl; aralkyl radicals such as benzyl and phenylethyl; and substituted forms of the foregoing in which some or all hydrogen atoms attached to carbon atoms are substituted by halogen atoms such as fluoro, bromo or chloro, typically halo-substituted alkyl radicals such as chloromethyl, bromoethyl and 3,3,3-trifluoropropyl. Inter alia, methyl and phenyl are preferred. The subscript m is an integer of 1 to 200, preferably an integer of 1 to 100, and more preferably an integer of 1 to 80.

Illustrative, non-limiting examples of the siloxanediamine having formula (6) are given below.

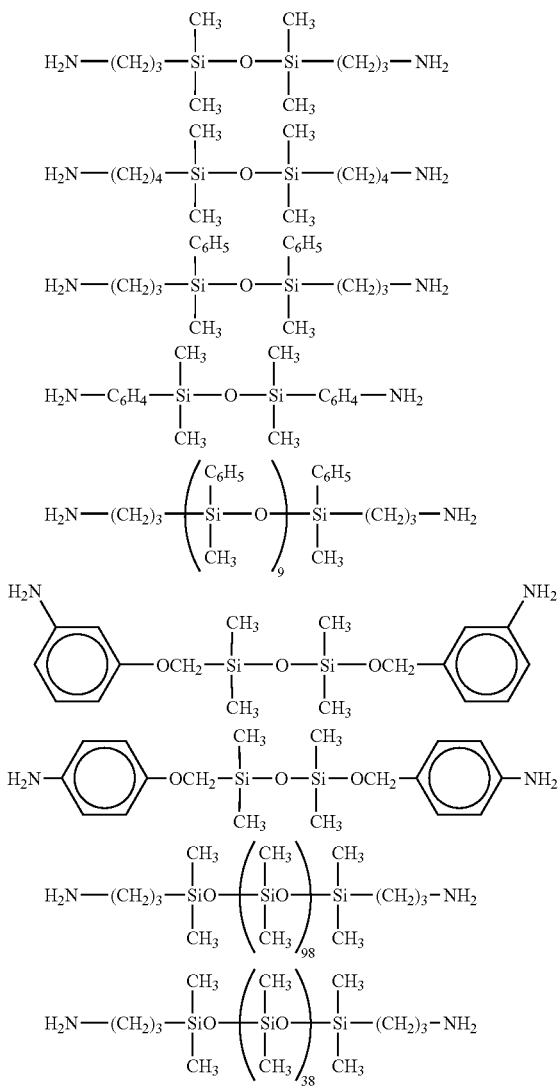

One or more compounds selected from the foregoing may be used as the diaminosiloxane having formula (6).

The diamine compounds having formula (5) excluding the diaminosiloxane compounds having formula (6) include, but are not limited to, aromatic ring-containing diamines such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenyl sulfone, 4,4'-diaminodiphenyl sulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, 2,2-bis[4-(4-aminophenoxy)phenyl]perfluoropropane.

Of these, preferred are p-phenylenediamine, m-phenylenediamine, 4,4'-diaminodiphenylmethane, 4,4'-diaminodiphenyl ether, 1,4-bis(3-aminophenoxy)benzene, 1,4-bis(4-aminophenoxy)benzene, 2,2-bis[4-(4-aminophenoxy)phenyl]propane, and 2,2-bis[3-methyl-4-(4-aminophenoxy)phenyl]propane.

One or more compounds selected from the foregoing may be used as the diamine.

Illustrated below is the reaction to form the polyamic acid resin or polyimide resin. In one procedure, the foregoing reactants are dissolved in a solvent in an inert atmosphere, and the reaction is effected at a temperature equal to or below 80° C., preferably 0° C. to 40° C., synthesizing a polyamic acid resin. The organic solvent used in the reaction may be even an organic solvent in which the reactants are not completely dissolvable, provided that it is inert to the resulting polyamic acid. Exemplary solvents include tetrahydrofuran, 1,4-dioxane, cyclopentanone, cyclohexanone, γ-butyrolactone, N-methylpyrrolidone, N,N-dimethylacetamide, N,N-dimethylformamide, and dimethyl sulfoxide. Of these, preferred are aprotic polar solvents, especially N-methylpyrrolidone, cyclohexanone and γ-butyrolactone. These solvents may be used alone or in admixture.

A dicarboxylic anhydride such as maleic anhydride or phthalic anhydride and/or a monoamine such as aniline or n-butylamine may be added in order to control the resin molecular weight. The amount of dicarboxylic anhydride added is typically 0 to 2 parts by weight per 100 parts by weight of the dicarboxylic dianhydride, and the amount of monoamine added is typically 0 to 2 parts by weight per 100 parts by weight of the diamine.

Component (B) is an alkoxysilyl-containing polyamic acid resin having the general formula (3):

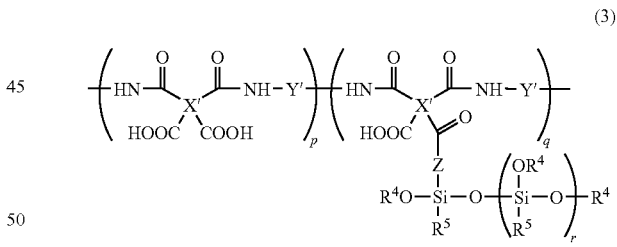

(3)

wherein X' is a tetravalent organic radical, Y' is a divalent organic radical, Z is a radical of the formula:

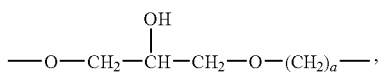

$R^4$ is $C_1$-$C_3$ alkyl, $R^5$ is $C_1$-$C_3$ alkyl or alkoxy, the subscript a is an integer of 0 to 4, p is an integer of 1 to 300, q is an integer of 1 to 300, and r is an integer of 1 to 100. The recurring units with the subscripts p and q are randomly arranged.

The alkoxysilyl-containing polyamic acid resin may be prepared by the reaction of a polyamic acid resin with an epoxy-containing alkoxysilane compound.

Like component (A), the polyamic acid resin used herein may be prepared by the reaction of substantially equimolar amounts of a tetracarboxylic dianhydride with a diamine in an organic solvent in an ordinary way. Examples of the tetracarboxylic dianhydride and the diamine used herein are as exemplified above for the structural formulae (4) and (5), respectively.

The polyamic acid resin should preferably have a weight average molecular weight (Mw) of about 3,000 to about 100,000 as measured versus polystyrene standards by gel permeation chromatography (GPC) or similar technique. With Mw of less than 3,000, the cured film may lose toughness and flexibility. Mw in excess of 100,000 corresponds to a high viscosity which may impede workability.

Through addition reaction of epoxy groups on an epoxy-containing alkoxysilane compound represented by the formula:

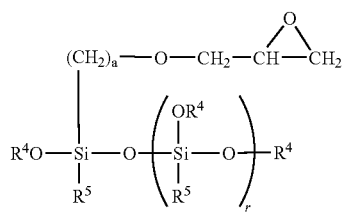

to carboxyl groups on the resulting polyamic acid resin, an alkoxysilyl-containing polyamic acid resin having formula (3) can be prepared.

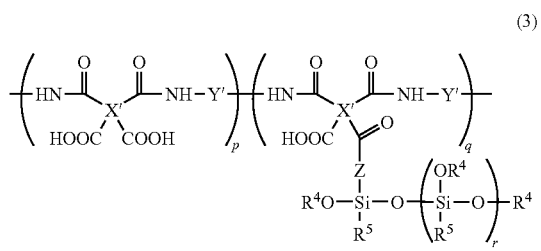

(3)

In the above formulae, X, Y, Z, $R^4$, $R^5$, a, p, q and r are as defined previously. Specifically, p and q are each independently an integer of 1 to 300, preferably an integer of 2 to 200; r is an integer of 1 to 100, preferably an integer of 2 to 80; and a is preferably equal to 0, 1, 2 or 3. The recurring units with the subscripts p and q are in random arrangement.

The reaction of carboxyl groups with epoxy groups can be effected in an ordinary way, typically at a temperature of 30 to 130° C. for a time of about 1 to 10 hours, and if necessary, in a solvent as exemplified above as the solvent used during the aforementioned polyamic acid resin synthesis. It is noted that the amount (or molar proportion) of the epoxy-containing alkoxysilane compound of the above formula used should be sufficient to form the compound of formula (3).

The alkoxysilyl-containing polyamic acid resin used herein may be a commercially available product, for example, Compoceran 800 series such as Compoceran H801D and H850D by Arakawa Chemical Industries, Ltd.

Component (C) is an organic solvent in which the foregoing components are partially or completely dissolved. Exemplary solvents include amide solvents such as N-methylpyrrolidone, N,N-dimethylacetamide, N,N-dimethylformamide, and 1,3-dimethyl-2-imidazolidinone; ether solvents such as tetrahydrofuran, 1,4-dioxane, anisole, diglyme, triglyme, and propylene glycol monomethyl ether acetate (PGMEA); ketone solvents such as cyclopentanone and cyclohexanone; γ-butyrolactone, and dimethyl sulfoxide. These solvents may be used alone or in admixture. Another solvent selected from aromatic hydrocarbons such as toluene and xylene and alcohols such as methanol, ethanol and propanol may be used in combination as long as solubility is not compromised.

To the resin solution composition of the invention, other additives including antioxidants, heat stabilizers, inorganic fillers (e.g., silica, alumina), and colorants such as pigments and dyes may be added if necessary for a certain purpose and as long as this does not compromise the objects of the invention.

Once the resin solution composition of the invention is applied to a substrate, water and the solvent are removed typically by heating at a temperature of at least 100° C., preferably at least 150° C., for a time of about 0.5 to 10 hours, thereby forming a uniform polyimide cured film having a flat surface. In some cases, for efficient removal of water and solvent in the resin composition out of the system and effective progress of reaction, the curing temperature is preferably increased stepwise. The cured film obtained by curing of the inventive composition exhibits excellent properties including heat resistance, mechanical properties, electrical properties, adhesion to substrates, and solvent resistance, due to the inclusion of imide rings, and additionally possesses a low modulus of elasticity and a low dielectric constant. Thus the composition can be applied by a variety of processes to various substrates, for example, as passivation film or protective film on semiconductor devices, typically semiconductor chip surface, junction protective film at junctions in diodes and transistors, alpha-ray barrier film and interlevel dielectric film in VLSI, and ion implantation masks, as well as conformal coatings on printed circuit boards, alignment layer of liquid crystal surface devices, glass fiber protective coatings, and solar battery surface protective coatings. The composition may also find use as paste, for example, printing paste compositions when blended with inorganic fillers, electroconductive paste compositions when blended with conductive fillers, and the like.

Once the cured film of the resin solution composition is formed on a semiconductor member, an epoxy resin molding material (molding compound) may be molded thereon for encapsulation. In the resulting semiconductor package, the cured film enhances the adhesion of the epoxy resin molding material (molding compound) to the substrate. The semiconductor package is fully reliable in that the epoxy resin molding material (molding compound) will not crack or peel from the substrate during solder reflow after moisture absorption.

The epoxy resin molding material (molding compound) used herein may be any of well-known semiconductor-encapsulating epoxy resin compositions comprising an epoxy resin having at least two epoxy groups per molecule, a curing agent for epoxy resin such as a phenolic resin or acid anhydride, an inorganic filler and the like. Use may also be made of commercially available epoxy resin compositions.

EXAMPLE

Synthesis Examples, Examples and Comparative Examples are given below for further illustrating the invention although the invention is not limited to these Examples. The starting compounds used herein are designated by the following abbreviations.
BPDA: 3,3',4,4'-biphenyltetracarboxylic dianhydride
BTDA: 3,3',4,4'-benzophenonetetracarboxylic dianhydride DPE: 4,4'-diaminodiphenyl ether APM: 1,3-bis(3-aminopropyl)-1,1,3,3-tetramethyldisiloxane Resin solution A: alkoxysilyl-containing polyamic acid resin solution commercially available as Compoceran H801D from Arakawa Chemical Industries, Ltd.

Resin solution B: alkoxysilyl-containing polyamic acid resin solution commercially available as Compoceran H850D from Arakawa Chemical Industries, Ltd.

Synthesis Example 1

A flask equipped with a stirrer, thermometer and nitrogen purge line was charged with 9.66 g (0.03 mole) of BTDA as a tetracarboxylic dianhydride component and 70 g of N-methyl-2-pyrrolidone. To the flask, a solution of 6.00 g (0.03 mole) of DPE as a diamine component in 18.7 g of N-methyl-2-pyrrolidone was slowly added dropwise so as to maintain the temperature of the reaction system below 50° C. After the completion of dropwise addition, the reaction mixture was stirred at room temperature for a further 12 hours for the reaction to proceed. A polyamic acid resin solution having a viscosity of about 700 mm²/s was obtained. It is designated polyamic acid resin solution #1.

Synthesis Example 2

In a reactor as used in Synthesis Example 1, a mixture of 48.33 g (0.15 mole) of BTDA, 3.73 g (0.015 mole) of APM, and 27.03 g (0.135 mole) of DPE in 448.2 g of N-methyl-2-pyrrolidone was allowed to react at room temperature for 12 hours, yielding a polyamic acid resin solution having a viscosity of about 500 mm²/s. It is designated polyamic acid resin solution #2.

Synthesis Example 3

In a reactor as used in Synthesis Example 1, a mixture of 8.83 g (0.03 mole) of BPDA, 4.20 g (0.021 mole) of DPE, and 7.56 g (0.009 mole) of a diaminosiloxane of the formula:

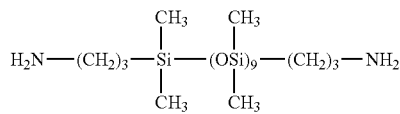

in 116.7 g of N-methyl-2-pyrrolidone was allowed to react at room temperature for 12 hours, yielding a polyamic acid resin solution having a viscosity of about 250 mm²/s. It is designated polyamic acid resin solution #3.

Examples and Comparative Examples

Six resin solution compositions were prepared by blending the polyamic acid resin solution with the alkoxysilyl-containing polyamic acid resin solution in accordance with the formulation shown in Table 1. From each composition, a cured film was formed and measured for complex elastic modulus, glass transition temperature (Tg), and adhesion after moisture absorption. The results are shown in Table 1.

Curing conditions:
100° C./0.5 hr+150° C./0.5 hr+250° C./4 hr

Complex elastic modulus:
Measured at 25° C. and 30 Hz by a dynamic viscoelasticity spectrometer by Yoshimizu Co., Ltd.

Tg:
A film strip of 5 mm wide was formed. Tg was measured using a thermomechanical tester TM-7000 by Ulvac-Riko, Inc.

Adhesion after moisture absorption:
Each resin solution composition was coated onto a nickel substrate and cured under the above-specified conditions. On the cured film, a semiconductor-encapsulating epoxy resin molding compound KMC-184-3 (by Shin-Etsu Chemical Co., Ltd.) was molded at 175° C. and 70 kgf/cm² for 120 seconds into a cylindrical form having a bottom area of 10 mm² and a height of 3 mm, followed by post-curing at 180° C. for 4 hours. The assembly was allowed to stand in a 85° C./85% RH atmosphere for 168 hours. After moisture absorption, it was subjected to 260° C. IR reflow. The peel strength between the molded resin and the test piece was measured by means of a push-pull gage.

TABLE 1

| Composition (pbw) | Example | | | Comparative Example | | |
|---|---|---|---|---|---|---|
| | 1 | 2 | 3 | 1 | 2 | 3 |
| Polyamic acid resin solution #1 | — | — | — | 100 | — | — |
| Polyamic acid resin solution #2 | 100 | — | 100 | — | 100 | — |
| Polyamic acid resin solution #3 | — | 100 | — | — | — | 100 |
| Resin solution A | 100 | 80 | — | — | — | — |
| Resin solution B | — | — | 100 | — | — | — |
| Results | | | | | | |
| Complex elastic modulus (GPa) | 2.8 | 1.4 | 2.6 | 4.5 | 2.5 | 1.0 |
| Tg (° C.) | 320 | 280 | 310 | 300 | 250 | 150 |
| Adhesion after moisture absorption (MPa) | 20.0 | 16.0 | 18.0 | 1.0 | 2.0 | 0.5 |

Japanese Patent Application No. 2005-187898 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A resin solution composition consisting of:
(A) a polyamic acid resin having the general formula (1):

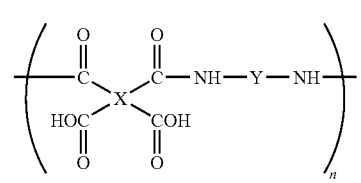

wherein
X is a tetravalent organic radical containing 1 to 4 aromatic or aliphatic rings,
Y is a divalent organic radical which comprises 10 to 50 mol % of a divalent organic radical having the structural formula (2):

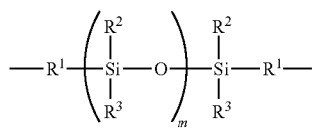
(2)

wherein $R^1$ is a divalent organic radical of 3 to 9 carbon atoms, $R^2$ and $R^3$ are each independently a substituted or unsubstituted monovalent hydrocarbon radical of 1 to 8 carbon atoms, and m is an integer of 1 to 99, and
n is an integer of 5 to 300,
(B) an alkoxysilyl-containing polyamic acid resin having the general formula (3):

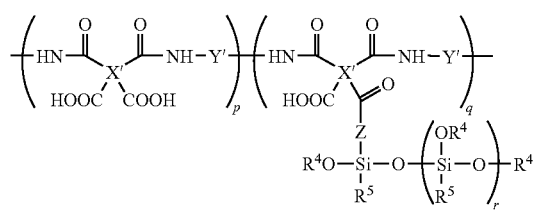
(3)

wherein
X' is a tetravalent organic radical,
Y' is a divalent organic radical,
Z is a radical of the formula:

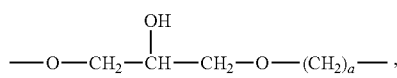

$R^4$ is $C_1$-$C_3$ alkyl,
$R^5$ is $C_1$-$C_3$ alkyl or alkoxy,
the subscript a is an integer of 0 to 4,
p is an integer of 1 to 300,
q is an integer of 1 to 300, and
r is an integer of 1 to 100,
wherein the recurring units with the subscripts p and q are randomly arranged, and
(C) at least one organic solvent selected from the group consisting of tetrahydrofuran, 1,4-dioxane, cyclopentanone, cyclohexanone, γ-butyrolactone, N-methylpyrrolidone N,N-dimethylacetamide, N,N-dimethylformamide, and dimethylsulfoxide.

2. A resin solution composition consisting of:
(A) a polyamic acid resin having the general formula (1):

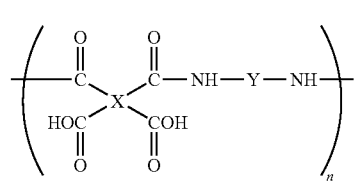
(1)

wherein
X is a tetravalent organic radical containing 1 to 4 aromatic or aliphatic rings,
Y is a divalent organic radical which comprises 10 to 50 mol % of a divalent organic radical having the structural formula (2):

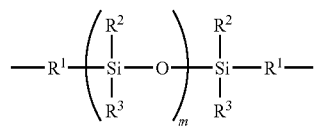
(2)

wherein $R^1$ is a divalent organic radical of 3 to 9 carbon atoms, $R^2$ and $R^3$ are each independently a substituted or unsubstituted monovalent hydrocarbon radical of 1 to 8 carbon atoms, and m is an integer of 1 to 99, and
n is an integer of 5 to 300,
(B) an alkoxysilyl-containing polyamic acid resin having the general formula (3):

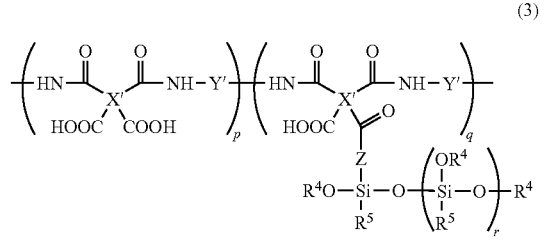
(3)

wherein
X' is a tetravalent organic radical,
Y' is a divalent organic radical,
Z is a radical of the formula:

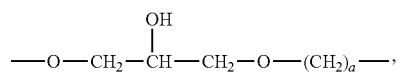

$R^4$ is $C_1$-$C_3$ alkyl, $R^5$ is $C_1$-$C_3$ alkyl or alkoxy, the subscript a is an integer of 0 to 4, p is an integer of 1 to 300, q is an integer of 1 to 300, and r is an integer of 1 to 100,
wherein the recurring units with the subscripts p and q are randomly arranged,
(C) at least one organic solvent selected from the group consisting of tetrahydrofuran, 1,4-dioxane, cyclopentanone, cyclohexanone, γ-butyrolactone, N-methylpyrrolidone, N,N-dimethylacetamide, N,N-dimethylformamide, and dimethylsulfoxide, and
(D) an additive selected from the group consisting of antioxidants, heat stabilizers, silica fillers, and colorants.

3. The resin solution composition of claim 1, wherein $R^2$ is methyl group and $R^3$ is methyl group.

4. The resin solution composition of claim 2, wherein $R^2$ is methyl group and $R^3$ is methyl group.

5. A polyimide resin obtained by curing the resin solution composition of claim 1.

6. A polyimide resin obtained by curing the resin solution composition of claim 2.

7. A semiconductor device coated with a cured film of the resin solution composition of claim 1.

8. A semiconductor device coated with a cured film of the resin solution composition of claim 2.

9. A semiconductor device encapsulated with an epoxy resin molding compound via the cured film of claim 1.

10. A semiconductor device encapsulated with an epoxy resin molding compound via the cured film of claim 8.

11. The resin solution composition of claim 1, wherein X is selected from the group consisting of the following formulae:

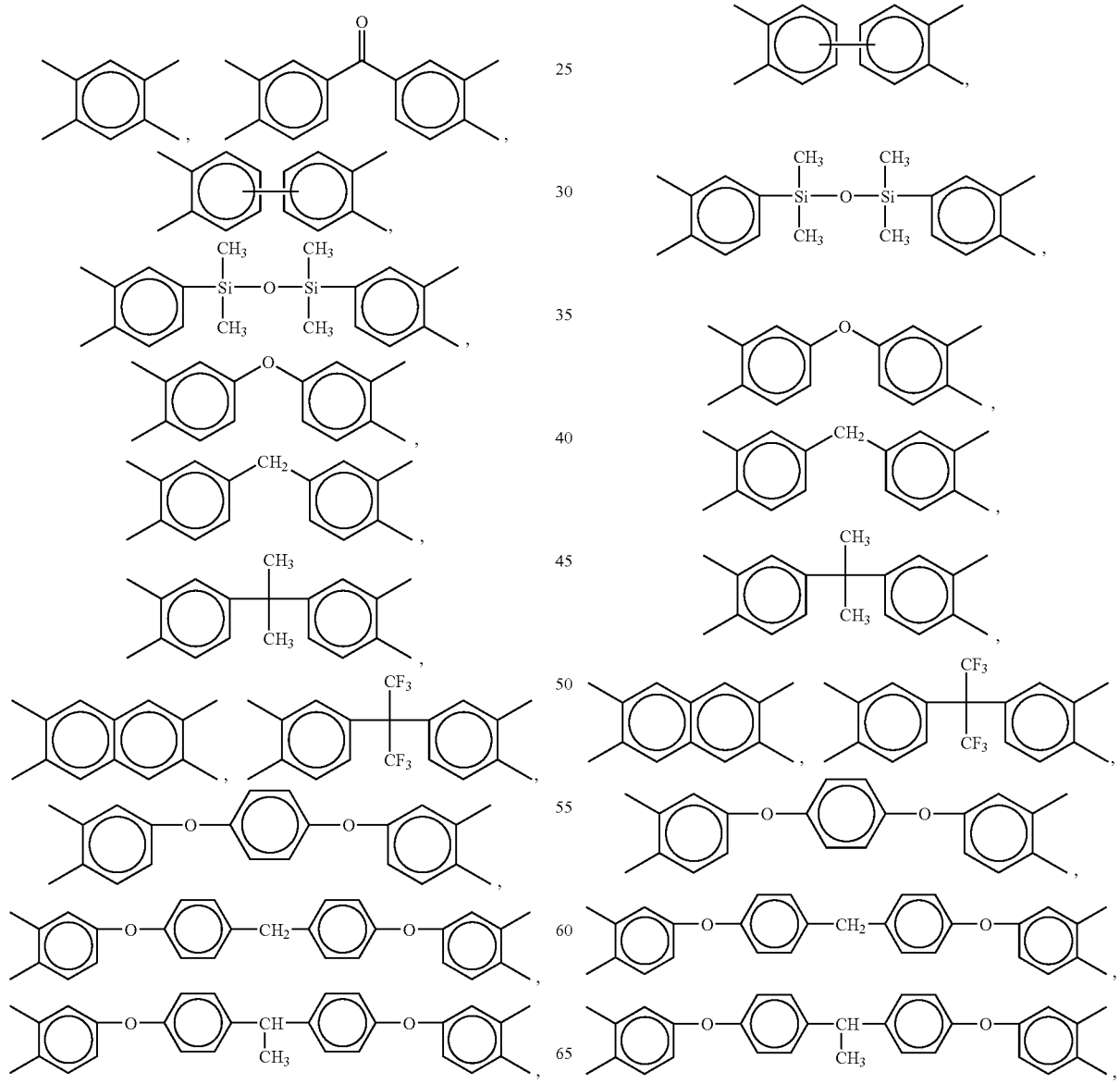

12. The resin solution composition of claim 2, wherein X is selected from the group consisting of the following formulae:

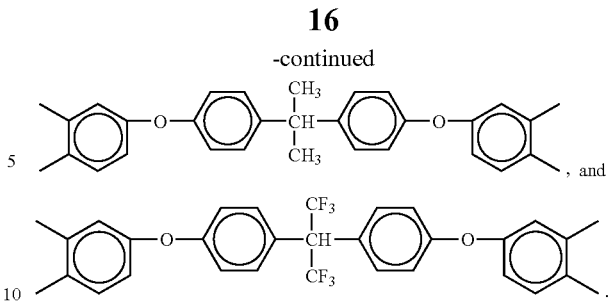

-continued
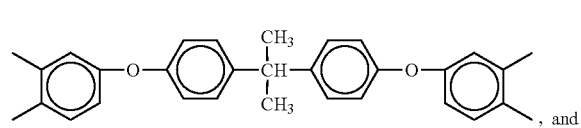, and
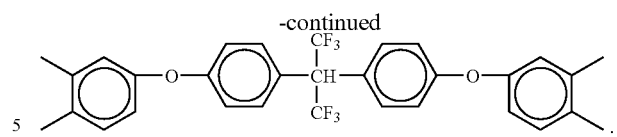.
* * * * *